(12) United States Patent
Angermeier et al.

(10) Patent No.: US 11,820,245 B2
(45) Date of Patent: Nov. 21, 2023

(54) STATIONARY INDUCTION CHARGING DEVICE FOR WIRELESS ENERGY TRANSFER

(71) Applicant: Mahle International GmbH, Stuttgart (DE)

(72) Inventors: Sebastian Angermeier, Stuttgart (DE); Thomas Himmer, Reichenbach (DE); Christopher Laemmle, Stuttgart (DE); Holger Schroth, Maulbronn (DE)

(73) Assignee: Mahle International GmbH

( * ) Notice: Subject to any disclaimer, the term of this patent is extended or adjusted under 35 U.S.C. 154(b) by 0 days.

(21) Appl. No.: 17/908,904

(22) PCT Filed: Mar. 3, 2021

(86) PCT No.: PCT/EP2021/055253
§ 371 (c)(1),
(2) Date: Sep. 1, 2022

(87) PCT Pub. No.: WO2021/175887
PCT Pub. Date: Sep. 10, 2021

(65) Prior Publication Data
US 2023/0089953 A1 Mar. 23, 2023

(30) Foreign Application Priority Data
Mar. 5, 2020 (DE) ...................... 10 2020 202 840.0

(51) Int. Cl.
*B60L 53/302* (2019.01)
*H02J 50/10* (2016.01)
(Continued)

(52) U.S. Cl.
CPC ............. *B60L 53/302* (2019.02); *B60L 53/12* (2019.02); *H02J 7/0042* (2013.01);
(Continued)

(58) Field of Classification Search
CPC ...... B60L 53/12; B60L 53/302; H02J 7/0042; H02J 50/005; H02J 50/10; H02J 50/70; H05K 7/20218
See application file for complete search history.

(56) References Cited

U.S. PATENT DOCUMENTS 10,083,788 B2 9/2018 Ko
2012/0112535 A1 5/2012 Karalis
(Continued)

FOREIGN PATENT DOCUMENTS

CN 106715187 A 5/2017
CN 108155682 A 6/2018
(Continued)

OTHER PUBLICATIONS

Mou Xiaolin et al., Survey on Magnetic Resonant Coupling Wireless Power Transfer Technology for Electric Vehicle Charging, Oct. 16, 2019, vol. 12, No. 12, pp. 3005-3020.
(Continued)

*Primary Examiner* — Eric S Ruppert
*Assistant Examiner* — Hans R Weiland
(74) *Attorney, Agent, or Firm* — Fishman Stewart PLLC

(57) ABSTRACT

A stationary induction charging device for wireless energy transfer may include a housing base, a housing cover, a transmitting coil, at least one magnetic field conductor, and a power electronics unit. The housing base and the housing cover may define an installation space and a venting space. The transmitting coil, the magnetic field conductor, and the power electronics unit may be arranged in the installation space. The housing base may include a plurality of coolant channels through which a liquid is flowable such that the housing base forms a heat exchanger. The plurality of coolant channels may be distributed within the housing base such that a region of the housing base arranged opposite the
(Continued)

power electronics unit and/or a region of the housing base arranged opposite the venting space has a higher coolant channel density than a region of the housing base arranged opposite the transmitting coil.

20 Claims, 2 Drawing Sheets

(51) Int. Cl.
    *H02J 50/70*     (2016.01)
    *B60L 53/12*     (2019.01)
    *H02J 50/00*     (2016.01)
    *H02J 7/00*     (2006.01)
    *H05K 7/20*     (2006.01)

(52) U.S. Cl.
    CPC ............ *H02J 50/005* (2020.01); *H02J 50/10* (2016.02); *H02J 50/70* (2016.02); *H05K 7/20218* (2013.01)

(56) References Cited

U.S. PATENT DOCUMENTS

| | | |
|---|---|---|
| 2017/0253129 A1 | 9/2017 | Garcia |
| 2018/0091001 A1 | 3/2018 | Meichle |
| 2018/0154781 A1 | 6/2018 | Ansari |
| 2018/0254136 A1* | 9/2018 | Ueda ........................ H02J 50/12 |
| 2020/0027640 A1* | 1/2020 | Laemmle ................ H02J 50/10 |
| 2020/0039369 A1 | 2/2020 | Burgermeister |
| 2020/0171967 A1 | 6/2020 | Gohla-Neudecker |
| 2020/0398681 A1* | 12/2020 | Laemmle .................. H02J 7/02 |

FOREIGN PATENT DOCUMENTS

| | | |
|---|---|---|
| CN | 209168894 U | 7/2019 |
| CN | 110789379 A | 2/2020 |
| DE | 102015218071 A1 | 5/2016 |
| DE | 102017213938 A1 | 10/2018 |
| DE | 102018203556 A1 | 9/2019 |
| EP | 2808976 A1 | 12/2014 |
| EP | 3065152 A1 | 9/2016 |
| JP | 2012228122 A | 11/2012 |
| KR | 1020190137319 | 12/2019 |
| WO | 2012090342 A1 | 7/2012 |
| WO | 2016143341 A1 | 9/2016 |

OTHER PUBLICATIONS

English abstract for KR-1020190137319.
English abstract for EP-2808976.
English abstract for JP-2012228122.
English abstract for EP-3065152.
German Search Report for DE-102020202840.0, dated Oct. 16, 2020.
Chinese Search Report dated Mar. 1, 2023 for CN202180018826.9 (w_English_translation).
Chinese Office Action dated Mar. 6, 2023 for CN202180018826.9 (w_English_translation).

* cited by examiner

STATIONARY INDUCTION CHARGING DEVICE FOR WIRELESS ENERGY TRANSFER

CROSS-REFERENCE TO RELATED APPLICATIONS

This application claims priority to International Patent Application No. PCT/EP2021/055253, filed on Mar. 3, 2021, and German Patent Application No. DE 10 2020 202 840.0, filed on Mar. 5, 2020, the contents of both of which are hereby incorporated by reference in their entirety.

TECHNICAL FIELD

The present invention relates to a stationary induction charging device for wireless energy transfer.

BACKGROUND

Conventional charging of electrically driven vehicles with a battery-powered electric drive motor takes place via a charging cable (plug-in). As electrically driven vehicles commonly have a very limited range owing to the low energy storage capacity of the batteries, frequent (daily, if necessary) and prolonged charging is necessary.

The driver is therefore compelled, after parking the vehicle, to initiate a charging process manually by inserting the charging cable into the vehicle. In addition to this frequent handling, which is felt to be inconvenient, the charging cable can be perceived as being a nuisance for the time of charging, as it possibly blocks paths and poses the danger of being a trip hazard. In order to increase the acceptance of electrically driven vehicles by end users, it can be advantageous if the energy transfer takes place in a contactless manner between a stationary energy source and an energy store of the vehicle. A contactless energy transfer is advantageous for end users, because for example no charging cables have to be carried along or inserted.

For a contactless energy transfer, a stationary induction charging device is always necessary which generates a magnetic alternating field for the contactless energy transfer.

Stationary induction charging devices exist in which the required components are distributed to two separate housings which are separated from one another, wherein the actual inductive charging region is installed in a housing on a base beneath a vehicle, whereas the power electronics components are accommodated separately on a wall in another housing, so that an expensive and lossy alternating current cable has to be laid between the two components.

Stationary induction charging devices also exist in which the required components are installed in a shared housing. Such a system is known for example from EP 3 065 152 A1, in which a primary coil and electronics for the supply thereof and/or the controlling of the or each primary coil are accommodated in a shared housing. In order to provide a sufficient cooling for the electronics, which are lossy with respect to heat, the electronics are accommodated in a compartment of the housing which has at least one lateral face with at least one row of cooling flues. Strictly speaking, the concern here is with a free convection flow which is extremely weak (lower heat dissipation) compared to a forced convection.

A disadvantage in this prior art is, for example, that such a convection flow can not occur if, for example, the stationary induction charging device is flooded with rainwater or is clogged with dirt.

From WO 2016/143341 A1 it is known furthermore to cool the stationary induction charging device inter alia via several cooling channels which are formed in the base. These cooling channels are open toward the exterior and can be flowed through by air or also rainwater and thereby the induction charging device can be cooled. A disadvantage here is, for example, that the cooling channels can become clogged and thereby no more cooling of the induction charging device can take place.

SUMMARY

The present invention is therefore concerned with the problem of indicating an improved or at least an alternative embodiment of a stationary induction charging device, which is optimized in particular with respect to the cooling strategy.

This problem is solved according to the invention by the subject matter of the independent claim(s). Advantageous embodiments are the subject matter of the dependent claim(s).

The present invention is based on the general idea that a housing base of a housing of a stationary induction charging device forms a heat exchanger through which liquid can flow. The stationary induction charging device according to the invention, for wireless energy transfer, comprises the housing base and a housing cover formed separately with respect to the housing base, which form an installation space and a venting space. The stationary induction charging device can be formed for wireless or respectively inductive energy transfer for a vehicle charging system. For a charging of an energy store of such a vehicle, the latter can be parked for example in the effective range of the stationary induction charging device. For this, the stationary induction charging device can be arranged on a base beneath the vehicle. The housing base and the housing cover can form a cuboid-shaped housing of the stationary induction charging device. The housing can have a width extent and/or a longitudinal extent which is greater than a vertical extent of the housing. The housing base can be configured substantially in a plate-shaped manner. The housing base can have two large faces lying opposite one another with respect to a coil winding axis, which large faces can be configured in a substantially flat and/or planar manner. The housing cover can be configured as an electrically non-conductive housing cover, in particular as a plastic housing cover. The housing cover can have a wall thickness of a few millimetres. The housing cover can be configured in a trough-like manner. The trough-like housing cover can have a plate-shaped portion, at the edging of which continuously circumferential sides and/or lateral regions are formed, which extend away from the plate-shaped portion, in particular extend away from the plate-shaped portion substantially along the coil winding axis. The sides and/or lateral regions can be chamfered for the purpose of better traversability. The large-faced upper and lower faces of the housing can be substantially flat and/or even.

While the plate-shaped portion of the trough-like housing cover can be arranged spaced apart from the housing base with respect to the coil winding axis, the sides and/or lateral regions of the trough-like housing cover can be connected to the housing base in a tight, in particular fluid-tight, manner with respect to an exterior environment of the stationary induction charging station. Here, the sides and/or lateral regions can be for example sealed, screwed or glued to the housing base.

The stationary induction charging device has a transmitting coil, arranged in the installation space, for generating a magnetic alternating field. The transmitting coil can be wound around a coil winding axis. A transverse axis can be aligned substantially perpendicularly, in particular perpendicularly, to the coil winding axis. The transmitting coil can form a primary coil of a vehicle charging system. The transmitting coil can be configured as a flat coil, in particular as a spiral flat coil and/or rectangular spiral flat coil. The primary coil (e.g. of copper) can be formed from individual strands which, in turn, can consist of individual chargers, which can be twisted with one another. The individual strands can be sheathed in an electrically insulating manner. The coil can have, as a whole, a round shape in cross-section. It can be laid in a spiral-like manner in a plane parallel to the base, however not round, but in a rectangular arrangement.

The stationary induction charging device has one, preferably several, magnetic field conductors arranged in the installation space, for directing the magnetic alternating field. The magnetic field conductors can be configured as separately formed magnetic field conductor plates, in particular as ferrite plates. A magnetic field conductor has a higher magnetic permeability compared to air. A magnetic field conductor can be formed at least partially from ferrimagnetic and/or ferromagnetic materials.

The stationary induction charging device has a power electronics unit, arranged in the installation space, for the power supply and/or actuation of the transmitting coil. The power electronics unit can comprise a TMN unit (Tunable Matching Network unit) and/or an IMN unit (Impedance Matching Network unit) and/or an inverter unit and/or a PFC unit (Power Factor Correction unit). The PFC unit can have a filter unit and/or a throttle unit and/or an intermediate circuit unit and/or other power electronics components or elements.

The transmitting coil, the magnetic field conductors and power electronics unit are arranged in a shared installation space of the stationary induction charging device.

The installation space is formed in a fluid-tight manner with respect to the venting space and in a fluid-tight manner with respect to an exterior environment of the stationary induction charging device.

The venting space is fluidically connected to the exterior environment, in particular to an air exterior environment of the exterior environment, of the stationary induction charging device for waste heat dissipation.

The housing base forms at least in part coolant channels through which fluid can flow, which are formed in a fluid-tight manner with respect to the installation space, the venting space and the exterior environment of the stationary induction charging device. The coolant channels can be fluidically connected to one another, in order to form a cooling channel system which is able to be fluidically connected to a coolant circuit. The coolant channels can be formed in a low pressure loss manner, and/or short, and/or connected in parallel, in order to be able to use a smaller and more favourable coolant conveying device, in particular a water pump and thus to reduce the additional energy requirement.

The housing base can be formed partly or entirely from an electrically conductive material, in particular aluminium, in order to form an electromagnetic shielding device, in particular an EMV shield plate. The housing base can be a few millimetres high.

The housing base can be formed by one or more aluminium plates. The coolant channels, through which liquid can flow, can be milled into a base material of a first aluminium plate and covered by a further aluminium plate, in particular a thinner-walled aluminium plate compared to the first aluminium plate, and sealed (e.g. by soldering). The housing base can be formed by an aluminium-tube-plate layered structure. The coolant channels can be formed here by separately formed flat tubes. The flat tubes can be arranged adjacent to one another on a plate, in particular a plate which is thin-walled compared to the width of the flat tubes, and covered with a further plate. The channels of the plates can also be embodied so that embossings are introduced into at least one of the plates in the layered structure, through which the coolants are directed.

By the coolant channels through which liquid can flow, the housing base forms a heat exchanger through which liquid can flow, for heat exchange from the installation space to the venting space and/or for heat exchange from the installation space to the exterior environment of the stationary induction charging device.

The exterior environment of the stationary induction charging device can be divided into an air exterior environment and a base exterior environment, wherein the stationary induction charging device, in particular the housing base, rests at least partly on this base exterior environment.

When the coolant channels of the housing base through which liquid can flow are flowed through by a liquid coolant, this liquid coolant can receive and discharge the heat occurring through the power loss of the transmitting coil, of the magnetic field conductors and/or of the power electronics unit within the installation space. The housing base, together with the venting space, forms a liquid-air heat exchanger, wherein the heat received by the liquid coolant is delivered at least partly to the air in the venting space, wherein the liquid coolant is cooled and the air present in the venting space is heated, wherein this heated air of the venting space is discharged to the air exterior environment of the stationary induction charging station. In addition, the liquid coolant can dissipate at least a portion of the received heat via heat conduction to the base exterior environment of the stationary induction charging station. Hereby, an optimized cooling strategy of the installation space can be provided.

The housing base can be screwed to the base or respectively the base exterior environment. Between the base plate and the base or respectively the base exterior environment, a thermal interface material (TIM) can be introduced (e.g. a silicone mat), which improves the heat transport. The thickness of the TIM mat can be configured so that unevennesses of the base (e.g. a garage substrate) are evened out and weight forces are evenly distributed.

In an advantageous further development of the solution according to the invention, provision is made that the coolant channels through which liquid can flow, formed by the housing base, have a spatial distribution, in particular an irregular spatial distribution, which is adapted to heat loss sources in the installation space so that an optimum and/or sufficient heat dissipation of these heat loss sources takes place and/or is formed.

Heat loss sources can be components which are arranged within the installation space and convert power dissipation into heat. Heat loss sources can be, for example, the transmitting coil, the magnetic field conductors, the power electronics unit and/or components of the power electronics unit.

According to the invention, provision is made that the coolant channels through which liquid can flow within the housing base are configured and/or spatially distributed such that a partial region of the housing base, which is arranged lying opposite the power electronics unit, has a higher coolant channel density than a partial region of the housing base, which is arranged lying opposite the transmitting coil, and/or that a partial region of the housing base which is arranged lying opposite the venting space has a higher coolant channel density than the partial region of the housing base which is arranged lying opposite the transmitting coil.

The partial region of the housing base, which is arranged lying opposite the power electronics unit, can be the partial region of the housing base which is arranged lying opposite the power electronics unit with respect to the coil winding axis.

The partial region of the housing base which is arranged lying opposite the transmitting coil can be the partial region of the housing base which is arranged lying opposite the transmitting coil with respect to the coil winding axis.

The partial region of the housing base which is arranged lying opposite the venting space can be the partial region of the housing base which is arranged lying opposite the venting space with respect to the coil winding axis.

The coolant channel density can be understood through the number of the coolant channels present with respect to the transverse axis per unit length. A unit length can be for example 5 cm along the transverse axis.

Hereby, on the one hand, the coolant channels through which liquid can flow are preferably formed in regions of the installation space in which higher power dissipation and hence a higher heat development occurs. On the other hand, an optimized and/or sufficient operation of the liquid-air heat exchanger, which is formed by the housing base and the venting space, can be made possible.

In an advantageous further development of the solution according to the invention, provision is made that heat loss sources, in particular electric power switching elements, of the power electronics unit for cooling are connected at least partly in a heat-conducting manner on the housing base, and/or that heat loss sources of the power electronics unit for cooling are coupled in a heat-transferring manner at least partly to the housing base through a forced convection by means of circulating air, which is encapsulated in a fluid-tight manner in the power electronics unit.

The components of the power electronics unit, which constitute heat loss sources, can be pressed against the housing base, in particular can be screwed on the housing base or glued on the housing base.

The electric power switching elements, in particular MOSFETs, can be arranged directly touching on the housing base. The electric power switching elements, in particular MOSFETs, can be connected to the housing base in a heat-conducting manner indirectly via a heat-conducting element, in particular of a thermal interface material (TIM). Electric power switching elements, which are arranged for example on the underside on plates of the components of the power electronics unit, can be cooled optimally or respectively to a sufficient extent via heat conduction.

The term "coupled in a heat-exchanging manner substantially through a forced convection by means of circulating air" is to be understood to mean that a heat exchange by means of heat conduction or free convection or heat radiation is small or respectively low and/or negligible compared to the heat exchange by means of the forced convection, due to construction, so that no sufficient heat dissipation of the heat loss sources is possible via the heat conduction or heat radiation.

The forced convection in the power electronics unit can be formed by mechanical action upon the air which is encapsulated in a fluid-tight manner in the installation space.

In the forced convection, the air which is encapsulated in the power electronics unit in a fluid-tight manner flows around the heat loss sources which are to be cooled and, in so doing, is itself heated. Through a circulation of this air within the power electronics unit, the heat received by the air can be dissipated to the housing base and in particular to a liquid coolant which flows through the housing base.

A sufficient cooling of the components of the power electronics unit can thus be provided, which are not arranged directly on the housing base.

In an advantageous further development of the solution according to the invention, provision is made that the transmitting coil for cooling is coupled in a heat-exchanging manner with the housing base substantially through a forced convection by means of circulating air which is encapsulated in a fluid-tight manner in the installation space, and/or that the magnetic field conductors for cooling are coupled in a heat-exchanging manner with the housing base substantially through a forced convection by means of circulating air which is encapsulated in a fluid-tight manner in the installation space.

The forced convection in the installation space can be formed by mechanical action upon the air which is encapsulated in a fluid-tight manner in the installation space.

In the forced convection, the air which is encapsulated in a fluid-tight manner in the installation space flows around the transmitting coil which is to be cooled and/or the magnetic field conductors which are to be cooled and, in so doing, is itself heated. Through a circulating of this air within the installation space, the heat received by the air can be dissipated to the housing base and in particular to a liquid coolant which flows through the housing base.

A sufficient cooling of the transmitting coil and/or of the magnetic field conductors can be provided through the housing base.

In an advantageous further development of the solution according to the invention, provision is made that the power electronics unit has a shielding housing formed separately with respect to the housing base and with respect to the housing cover, which shielding housing lies at least partially touching on the housing base and at least partially touching on the housing cover, and/or that the transmitting coil and/or the magnetic field conductors are arranged respectively spaced apart from the housing base and spaced apart from the housing cover, and/or that the transmitting coil and the magnetic field conductors are arranged spaced apart from one another.

The shielding housing of the power electronics unit can be formed from an electrically conductive material, in particular from aluminium. The shielding housing can be formed from a solid sheet metal, e.g. from an aluminium sheet metal. The shielding housing of the power electronics unit is formed on the one hand for the electromagnetic shielding and on the other hand for the mechanical protection of the components of the power electronics unit, which are arranged in the shielding housing. The components of the power electronics unit can be surrounded peripherally continuously by the shielding housing.

The shielding housing can be configured in such a way and arranged in the installation space in such a way that external forces acting from the exterior onto the stationary induction charging device, such as for example a weight force acting through a vehicle, are passed on or respectively transferred from the housing cover via the shielding housing to the housing base, so that the components of the power electronics unit in the shielding housing are not mechanically stressed by such external forces or, if applicable, destroyed.

The transmitting coil and/or the magnetic field conductors can be arranged spaced apart from the housing base respectively with respect to the coil winding axis and spaced apart from the housing cover. Hereby, for example, a sufficient free space can be provided for the flowing around of the transmitting coil and/or of the magnetic field conductors.

The transmitting coil and the magnetic field conductors can be arranged spaced apart from one another with respect to the coil winding axis. The magnetic field conductors with respect to one another can be arranged for example spaced apart from one another with respect to the transverse axis.

In an advantageous further development of the solution according to the invention, provision is made that the power electronics unit has a shielding housing (e.g. of aluminium), which in regions which face the transmitting coil and/or the magnetic field conductors is adapted at least in part such that an impairment to the magnetic alternating field generated by the transmitting coil is reduced and/or prevented, and/or that exterior magnetic field conductors, which are arranged at least partly around the transmitting coil, are adapted, in particular are inclined to the transverse axis, such that magnetic losses in the outer region around the transmitting coil are reduced, and/or that the housing cover has chamfered lateral regions. Exterior magnetic field conductors can be understood to be those magnetic field conductors which are arranged around the transmitting coil with respect to the transverse axis. Outer region of the transmitting coil can be understood to mean the region, in particular the region within the installation space, which is formed around the transmitting coil with respect to the transverse axis.

The shielding housing can be adapted and/or formed by a partial chamfer and/or depression such that it is arranged outside the effective range of the magnetic alternating field generated by the transmitting coil. "Outside the effective range" can be understood to mean that the shielding housing can be adapted and/or formed by a partial chamfer and/or depression such that it is influenced sufficiently little by the magnetic alternating field generated by the transmitting coil.

The magnetic field conductors within the installation space can be divided into a group of inner magnetic field conductors and into a group of exterior magnetic field conductors, wherein the inner magnetic field conductors are arranged lying opposite the transmitting coil exclusively with respect to the coil winding axis, whereas the exterior magnetic field conductors are arranged lying opposite the transmitting coil at least partially with respect to the transverse axis. The magnetic field conductors, in particular the exterior magnetic field conductors, can be set in the peripheral region obliquely outward upwards, and/or shaped accordingly, in order to reduce magnetic losses in this region.

The chamfered lateral regions of the housing cover make possible for example a better traversability of the stationary induction charging device. The chamfered lateral regions of the housing cover can form reinforcement ribs on the side facing the installation space and/or venting space for increasing the mechanical resistance, in particular the strength, of the housing cover.

In an advantageous further development of the solution according to the invention, provision is made that a holding structure, receiving the coil, is arranged in the installation space, and that a support structure formed separately with respect to the coil-receiving holding structure, is arranged in the installation space, wherein the coil-receiving holding structure and the support structure are formed respectively separately with respect to the housing base and separately with respect to the housing cover, wherein the transmitting coil is received by the coil-receiving holding structure, wherein the coil-receiving holding structure is arranged at least partially on the housing cover and at least partially on the magnetic field conductors, wherein the support structure is arranged at least partially on the housing base and at least partially on the magnetic field conductors.

The magnetic field conductors, in particular the inner magnetic field conductors, can be arranged with respect to the coil winding axis between the coil-receiving holding structure and the support structure.

The transmitting coil and the magnetic field conductors can be arranged through the coil-receiving holding structure and the support structure for example approximately centrally with respect to the coil winding axis in the installation space.

The holding structure can be a plastic holding structure which is formed from plastic. The support structure can be a plastic support structure which is formed from plastic. The holding structure has the tasks of accommodating the transmitting coil, of receiving the weight forces acting onto the housing cover and of passing them on, in an evenly distributed manner, along the coil winding axis in the direction of the housing base, and of creating a cavity, in particular a circulation venting space, which the air, encapsulated in the installation space, can flow through.

The transmitting coil can be clamped and/or clipped into a partial region of the holding structure which is spaced apart from the housing cover, such that the transmitting coil can be flowed against by the surrounding circulating air within the housing and is accessible via openings of the holding structure accordingly.

The support structure has the tasks of accommodating the magnetic field conductors, of receiving the occurring weight forces and passing them on in an evenly distributed manner along the coil winding axis in the direction of the housing base, and of creating a cavity, in particular an incident flow space, in which air can circulate. The holder structure can be formed here so that the magnetic field conductors can still be flowed against to a sufficient extent for the purpose of cooling by the surrounding circulating air within the installation space, and are accessible for this accordingly via openings.

In an advantageous further development of the solution according to the invention, provision is made that the coil-receiving holding structure forms within the installation space a circulation venting space for incident flow on the transmitting coil, and that the support structure forms within the installation space an incident flow space for incident flow on at least a partial region of the housing base, wherein the circulation venting space and the incident flow space are fluidically connected to one another. Hereby, a sufficient cooling of the transmitting coil and/or of the magnetic field conductors can be guaranteed, wherein the heat received by the air can be delivered to the housing cover. The heat can be dissipated primarily via the coolant in the housing base. This housing base can be flowed against by the air in the circulation venting space.

In an advantageous further development of the solution according to the invention, provision is made that the coil-receiving holding structure and/or the support structure has at least one incident flow opening for the at least partial incident flow on the magnetic field conductors.

The coil-receiving holding structure and/or the support structure can respectively form several incident flow openings, spaced apart from one another, in order to guarantee a uniform cooling of the transmitting coil and/or of the magnetic field conductors.

In an advantageous further development of the solution according to the invention, provision is made that the coil-receiving holding structure forms several structure columns spaced apart from one another, and/or that the support structure forms several support columns spaced apart from one another. The structure columns can have respectively a longitudinal extent along the coil winding axis and a circular cross-section in a plane perpendicular to the coil winding axis. The structure columns can have a longitudinal extent along the coil winding axis of 15 mm to 25 mm, in particular of 20 mm.

The spacing of the structure columns from one another in a plane perpendicular to the coil winding axis can be configured such that the air flowing through between the structure columns can flow against the transmitting coil.

The support columns can have respectively a longitudinal extent along the coil winding axis and a circular cross-section in a plane perpendicular to the coil winding axis. The support columns can have a longitudinal extent along the coil winding axis of 15 mm to 35 mm, in particular of 20 mm.

The spacing of the support columns from one another in a plane perpendicular to the coil winding axis can be configured such that the air flowing through between the structure columns can flow against the magnetic field conductors.

In an advantageous further development of the solution according to the invention, provision is made that the housing base has a ribbing structure projecting into the installation space, in particular into the incident flow space, to increase the surface of the housing base, and/or that the housing base has a ribbing structure projecting into the venting space, to increase the surface of the housing base, and/or that the housing cover, in particular the chamfered lateral regions of the housing cover, has a reinforcement rib structure projecting into the installation space and/or venting space, to increase the mechanical resistance of the housing cover. The reinforcement rib structure can form one or more reinforcement ribs which project into the installation space and/or venting space. The reinforcement rib structure, in particular its reinforcement ribs, can be formed separately with respect to the support structure and/or separately with respect to the holding structure.

The ribbing structure of the housing base can be formed for example via soldered-on corrugated ribs, which are applied on partial regions and/or surfaces of the housing base, which lie opposite the installation space, in particular the incident flow space, and/or the venting space, in particular lie opposite with respect to the coil winding axis.

In an advantageous further development of the solution according to the invention, provision is made that in the installation space a detecting device, in particular a sensor plate, is arranged which lies against the housing cover, and/or that in the installation space at least one or more fans are arranged, in order to form a circulation of the air which is encapsulated in the installation space in a fluid-tight manner, and/or that in the power electronics unit at least one or more fans are arranged, in order to form a circulation of the air which is encapsulated in the power electronics unit in a fluid-tight manner.

The coil-receiving holding structure and/or the housing cover can be configured so that a detecting device, in particular a sensor plate, arranged therebetween does not have to receive a weight force. LOD components (Living Object Detection components), such as for example sensors for motion detection, can be arranged on the housing cover within the installation space and/or venting space between reinforcement ribs of a reinforcement rib structure of the chamfered lateral regions of the housing cover. The LOD components can be arranged in a sufficient quantity in the outer peripheral region of the stationary induction charging device, in order to detect whether persons or animals are approaching the system, which makes further operation prohibited for safety reasons.

The detecting device, in particular a sensor plate of FOD sensor plate (Foreign Object Detection sensor plate) can be situated directly beneath the plastic housing cover. Between the FOD sensor plate and the upper edge of the housing cover, preferably a distance of a few millimetres, in particular of 1 mm to 3 mm, is not exceeded with respect to the coil winding axis. The FOD sensor plate detects metallic parts on the surface of the charging unit, which because of regulations possibly makes further operation impermissible.

The detecting device, in particular the sensor plate or FOD sensor plate, and/or the LOD components can be connected in a communicating manner with a control arrangement of the stationary induction charging device, wherein the control arrangement can be configured such that the generating of a magnetic alternating field is interrupted when the measurement signals of the detecting device and/or the measurement signals of the LOD components indicate an impermissible operation.

In the installation space at least one or more fans are arranged, in order to form and/or enable a circulation of the air which is encapsulated in the installation space in a fluid-tight manner.

In the lateral and/or central region of the coil-receiving holding structure, fans can be provided which keep the circulating air in motion in a uniformly distributed manner above the transmitting coil, and thus cool the transmitting coil. The circulating air is to circulate here as far as possible so that the heat is delivered to the housing base, in particular to the ribbed housing base.

In the lateral and/or central region of the support structure, fans can be provided which keep the circulating air in motion beneath the magnetic field conductors in an evenly distributed manner and thus cool the magnetic field conductors. The circulating air is to circulate here as far as possible so that the heat is delivered to the housing base, in particular to the ribbed housing base.

The fans in the installation space and/or in the power electronics unit can be configured as axial fans or respectively axial ventilators or as radial fans (axial intake, radial outflow).

In an advantageous further development of the solution according to the invention, provision is made that the partial region of the housing cover, which partially forms the venting space, forms at least one or more inlet venting openings, via which an external air of the external environment of the stationary induction charging device can flow into the venting space, and that the partial region of the housing cover, which partially forms the venting space, forms at least one or more outlet venting openings, via which the air present in the venting space can flow out into the exterior environment of the stationary induction charging device, and/or that in the venting space at least one or more fans are arranged in order to draw in the exterior air of the exterior environment into the venting space and/or in order to dissipate the air present in the venting space into the exterior environment.

The fans can be designed and arranged in the venting space so that noise emissions are reduced as much as possible. For this, the fans can be arranged for example as far away as possible from the inlet venting openings and/or outlet venting openings. Between the fans and the inlet venting openings and/or between the fans and the outlet venting openings, one sound absorber pipe or several sound absorber pipes can be arranged. Between the fans and the inlet venting openings and/or between the fans and the outlet venting openings, one sound absorber wall or several sound absorber walls can be arranged.

Between inlet venting openings and outlet venting openings, no mixing and no short circuit should occur. This can be formed and/or realized through spatial separation of the inlet venting openings and outlet venting openings and/or through additional dividing walls and/or flow deflector plates.

The inlet venting openings and/or outlet venting openings can be configured so that as little dust, dirt and/or water as possible can penetrate into the venting space. For this, for example, obliquely placed blades are mounted above or below the inlet venting openings (within or outside the venting space) and/or outlet venting openings, so that dirt and water coming from above is directed away. Furthermore, the inlet venting openings and/or outlet venting openings can be covered by an air-permeable fabric or net. Provision can also be made that a dirt filter is introduced. The region of the housing cover, which at least partially forms the venting space, can be configured having several parts, wherein a partial region of this multi-part region of the housing cover can be opened, in order to enable cleaning- and/or maintenance work in the venting space. The multi-part region of the housing cover can form an inspection flap.

The fans arranged in the venting space, in particular their motors and electrical connections, can be formed in a water-tight manner. The housing base and/or the housing cover can have respectively a drainage opening or several drainage openings for the drainage of the venting space. The dewatering openings of the housing cover can be formed in lateral regions of the housing cover, in particular in the vicinity of the housing base. Hereby, even in the case of a flooding of the venting region with exterior water (e.g. in the case of storms or water damage), the operation of the induction charging device is not impaired. The drainage openings arranged in the lower region of the cover or of the housing/venting space can be closable, in order to prevent undesired penetration of dirt, pests and water.

The fans in the venting space can be formed as axial fans or respectively axial ventilators or radial fans.

In an advantageous further development of the solution according to the invention, provision is made that the housing base, in particular the coolant channels, is fluidically connected with a coolant conveying device for the formation of a closed coolant circuit, wherein a liquid coolant is encapsulated in the coolant circuit, wherein the coolant conveying device is formed for conveying the liquid coolant through the housing base, in particular through the coolant channels, and through the closed coolant circuit.

The housing base and the coolant conveying device can be connected to one another via fluid lines. The liquid coolant can be cooling water, for example. The coolant conveying device can be an electrically driven water pump, for example.

In the region of the installation space, for example further components such as boards (e.g, for sensor plates), cables and/or the water pump can be installed between the magnetic field conductors and the housing base with respect to the coil winding axis. The stationary induction charging device can be connected via a single-phase or multi-phase, in particular a three-phase, power cable or respectively supply line, and supplied with mains alternating current. This power cable or respectively this supply line can be connected in an air-tight and water-tight manner to the stationary induction charging device, in particular to the power electronics unit.

The three essential structural units: transmitting coil, power electronics unit and venting space, can also be spatially separate from one another. This can take place in that the housing base is interrupted or respectively divided, so that a first part of the housing base is assigned to the transmitting coil, a second part is assigned to the power electronics and a third part is assigned to the venting space, and the respective housing base parts are no longer cohesive. The delivery of the coolant from one housing base part to the next, which flows in the housing base parts in coolant channels, can then be implemented by means of connection pieces/flanges/lines/hoses. A spatial separation between power electronics and transmitting coil can be achieved via a further dividing wall.

In a preferred manner, the housing bases are soldered sheet layer structures. The housing cover can also be interrupted or respectively divided, so that a first part of the housing cover is assigned to the transmitting coil, a second part is assigned to the power electronics and a third part is assigned to the venting space, and the respective housing cover parts are no longer cohesive, but rather cover the part units individually. The part units can be arranged here at almost any desired distance with respect to one another. Electric connections/lines can exist between the part units, which can be directed for example in pipes or hoses or in a drive-over protection. The inlets and outlets of the electric lines on the part units can be connected, like the coolant lines, by means of flanges/connection pieces/plug connectors, and sealed. The power electronics unit can be further subdivided into several part units.

The power electronics unit can be encased by a metallic shielding housing, in particular made of aluminium, and shielded magnetically. This shielding housing can be embodied having several parts and can itself contain coolant channels, so that a separate housing base, flowed through by coolant, is not required in this part unit. For this purpose, the shielding housing also has flanges/connection pieces/plug connectors for the connection of coolant lines and electric lines.

Further important features and advantages of the invention will emerge from the subclaims, from the drawings and from the associated figure description with the aid of the drawings.

It shall be understood that the features mentioned above and to be explained further below are able to be used not only in the respectively indicated combination, but also in other combinations or in isolation, without departing from the scope of the present invention.

Preferred example embodiments of the invention are illustrated in the drawings and are explained more closely in the following description, wherein the same reference numbers relate to identical or similar or functionally identical components.

BRIEF DESCRIPTION OF THE DRAWINGS

There are shown, respectively schematically

DETAILED DESCRIPTION

Figures 1, 2:
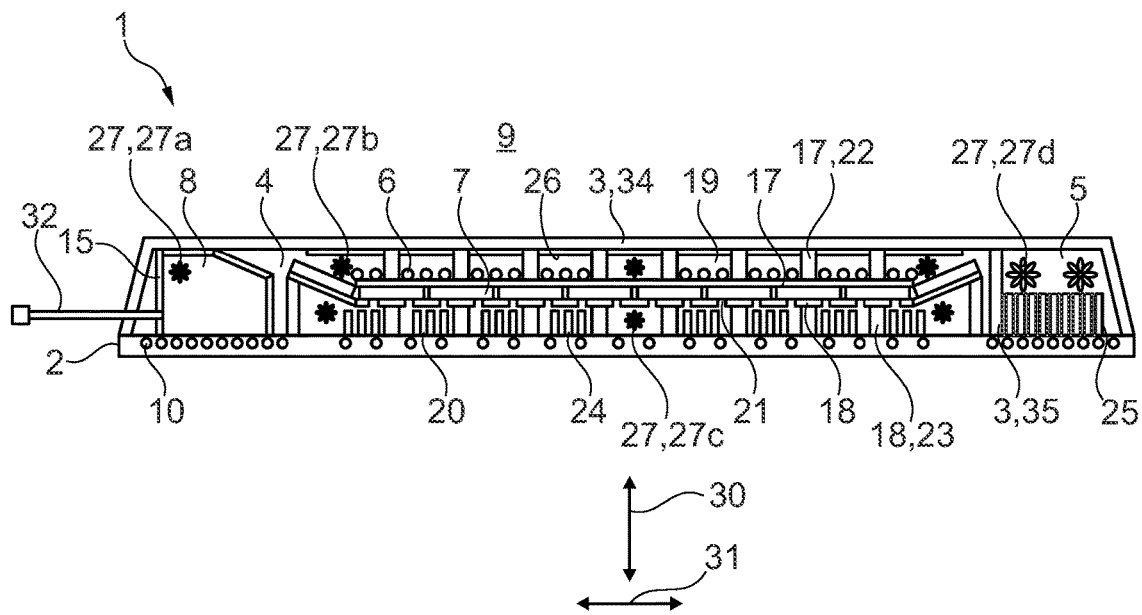
FIG. 1 shows a cross-section through a stationary induction charging device according to the invention.
FIG. 2 shows a cross-section through a stationary induction charging device according to the invention.

FIG. 1 and FIG. 2 show an identical cross-section through an induction charging device 1 according to the invention, wherein the reference numbers were distributed to these two figures for the sake of clarity.

The stationary induction charging device 1 comprises a housing base 2 and a housing cover 3, formed separately with respect to the housing base 2, which form an installation space 4 and a venting space 5.

The installation space 4 is formed in a fluid-tight manner with respect to the venting space 5 and in a fluid-tight manner with respect to an exterior environment 9 of the stationary induction charging device 1. In other words, the installation space 4 forms a closed, sealed space, into which no air or other media can penetrate from the exterior environment 9, and from which no air or other can escape into the exterior environment 9.

The housing cover 3 is configured in a trough-like manner and has a plate-shaped portion 34, at the edging of which sides and/or lateral regions 16, in particular 16a and 16b, are formed continuously circumferentially, which extend away from the plate-shaped portion. The sides and/or lateral regions 16 are chamfered for the purpose of better traversability. Whereas the plate-shaped portion 34 of the trough-like housing cover 3 is arranged spaced apart from the housing base 2 with respect to a coil winding axis 30, the sides and/or lateral regions 16 of the trough-like housing cover 3 are connected with the housing base 2 in a tight, in particular fluid-tight, manner with respect to an exterior environment 9 of the stationary induction charging station 1. The housing cover 3 comprises a dividing wall 35, which enables a fluidic separation of the installation space 4 and of the venting space 5.

The venting space 5 is fluidically connected via inlet venting openings and/or outlet venting openings, not illustrated, with the exterior environment 9 of the stationary induction charging device 1 for waste heat dissipation or respectively for air exchange.

In the installation space 4 a transmitting coil 6 is arranged for generating a magnetic alternating field, which transmitting coil forms a wound flat coil around the coil winding axis 30. Here, the respective transmitting coil 6 windings can be arranged spaced apart from one another with respect to a transverse axis 31, which is aligned perpendicular [ ] coil winding axis 30.

Furthermore, several magnetic field conductors 7, spaced apart from one another, are arranged in the installation space 4, wherein inner magnetic field conductors 7a are arranged exclusively lying opposite the transmitting coil 6 with respect to the coil winding axis 30. Exterior magnetic field conductors 7b, compared to inner magnetic field conductors 7a are also arranged lying opposite the transmitting coil 6 with respect to the transverse axis 31. The exterior magnetic field conductors 7b are arranged obliquely with respect to the inner magnetic field conductors 7a, in order to minimize magnetic losses in the marginal region of the transmitting coil 6.

The transmitting coil 6 is carried by a holding structure 17, receiving the coil, which holding structure is arranged with respect to the coil winding axis 30 between the magnetic field conductors 7 and the housing cover 3.

The magnetic field conductors 7 are carried by a support structure 18, which is arranged with respect to the coil winding axis 30 between the magnetic field conductors 7 and the housing base 2. The inner magnetic field conductors 7a are arranged with respect to the coil winding axis 30 between holding structure 17 and the support structure 18.

By means of the holding structure 17, the transmitting coil 6 is arranged in the installation space 4 with respect to the coil winding axis 30 spaced apart both from the housing base 2 and housing cover 3 and also from the inner magnetic field conductors 7a. By means of the support structure 18, the magnetic field conductors 7 are arranged spaced apart both from the housing base 2 and housing cover 3 and also from the transmitting coil 6.

The coil-receiving holding structure 17 has several structure columns 22, spaced apart from one another, and forms within the installation space 4 a circulation venting space 19 for incident flow on the transmitting coil. The support structure 18 has several support columns 23, spaced apart from one another, and forms within the installation space 4 an incident flow space 20 for incident flow at least on a partial region of the housing base 2, wherein the circulation venting space 19 and the incident flow space 20 are fluidically connected to one another. The support structure 18 has several incident flow openings 21, spaced apart from one another, which enable an incident flow on the magnetic field conductors 7 and thus a cooling of the magnetic field conductors 7.

In the installation space 4 a detecting device 26, in particular a sensor plate, is arranged, which lies against the housing cover 3. The detecting device 26 is arranged so that no exterior weight force acts on it.

Furthermore, a power electronics unit 8 is arranged in the installation space 4 for power supply and/or actuation of the transmitting coil 6. The power electronics unit 8 has a shielding housing 15, which in regions facing the transmitting coil 6 and/or the magnetic field conductors 7 has a chamfered region 33, in order to prevent a disadvantageous influencing of the magnetic alternating field. The stationary induction charging device 1, in particular the power electronics unit 8, is supplied with electric power via a supply line 32.

The three essential structural units: transmitting coil 6, power electronics unit 8 and venting space 5 can also be spatially separated from one another. This can take place in that the housing base 2 is interrupted or respectively divided, so that a first part of the housing base 2 is assigned to the transmitting coil 6, a second part is assigned to the power electronics 8 and a third part is assigned to the venting space 5, and the respective housing base parts are no longer cohesive. The delivery of the coolant from one housing base part to the next, which flows into the housing base parts in coolant channels 10, can then be implemented by means of connection pieces/flanges/lines, hoses. A spatial separation between power electronics unit 8 and transmitting coil 6 can be achieved via a further separating wall which is not shown. The housing bases are preferably soldered sheet layer structures. The housing over 3 can also be interrupted or respectively divided, so that a first part of the housing cover 3 is assigned to the transmitting coil 6, a second part is assigned to the power electronics unit 8 and a third part is assigned to the venting space 5, and the respective housing cover parts are no longer cohesive, but rather cover the part units individually. The part units can be arranged here at almost any desired distance with respect to one another. Electric connections/lines can exist between the part units, which connections/lines are directed for example in pipes or hoses or in a drive-over protection. The inlets and outlets of the electric lines on the part units can be connected, like the coolant channels 10, by means of flanges/connection pieces/plug connectors, and sealed. Furthermore, the power electronics unit 8 can be subdivided into several part units.

The power electronics unit 8 can be surrounded and magnetically shielded by a metallic shielding housing, in particular of aluminium. This shielding housing can be embodied having several parts and itself contain coolant lines, so that a separate housing base 2, flowed through by coolant, is not required in this part unit. The shielding housing also has for this purpose flanges/connection pieces/plug connectors for the connection of coolant lines and electric lines.

Figure 3:
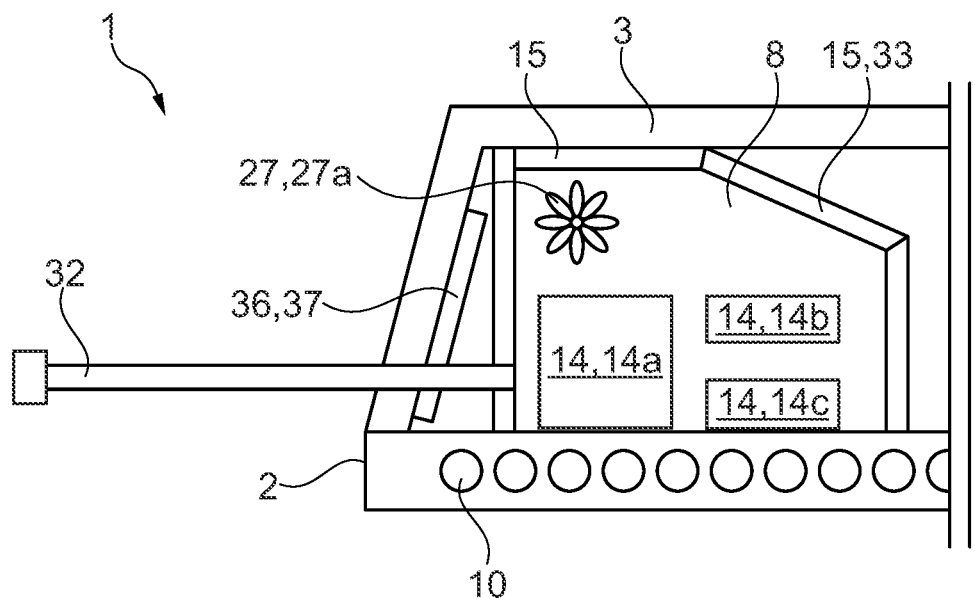
FIG. 3 shows an enlarged partial cut-out of a cross-section through a stationary induction charging device according to the invention.

The power electronics unit 8 is illustrated in FIG. 3 in an enlarged cut-out, wherein several heat loss sources 14 of the power electronics unit 8 are illustrated schematically. The heat loss source 14, 14*a* can comprise for example electric or electronic components of electric or electronic switching arrangements such as filter circuits and oscillating circuits. The heat loss source 14, 14*b* can form an intermediate circuit. The heat loss source 14, 14*c* can comprise, in particular, electric power switching elements, such as e.g. MOSFETs which, for cooling, are connected to the housing base 2 at least partly in a heat-conducting manner. The partial regions of the heat loss sources 14 which are not connected to the housing base 2 in a heat-conducting manner are coupled, for cooling, in a heat-exchanging manner at least partly to the housing base 2 through a forced convection by means of circulating air which is encapsulated in a fluid-tight manner in the power electronics unit 8. For this, in the power electronics unit 8 at least one fan 27, 27*a* is arranged, which circulates the air in the power electronics unit 8. This air is heated here by the heat loss sources 14 and can emit this heat to the housing base 2.

In FIG. 3 by way of example a reinforcement rib structure 36 with at least one reinforcement rib 37 is indicated.

The housing base 2 has a ribbing structure 24, projecting into the installation space 4, in particular into the incident flow space 20, to increase the surface of the housing base 2. Furthermore, the housing base 2 has a ribbing structure 25, projecting into the venting space 5, to increase the surface of the housing base 2.

In the installation space 4 several fans 27, 27*b* are arranged, which are arranged with respect to the coil winding axis 30 between the magnetic field conductors 6 and the housing cover 3. In the installation space 4 several fans 27, 27*c* are arranged, which are arranged with respect to the coil winding axis 30 between the magnetic field conductors 6 and the housing base 2. The fans 27, 27*b* and fans 27, 27*c* are configured for the circulating of the air in the installation space 4. Several fans 27, 27*d* are arranged in the venting space, in order to enable an air exchange with the exterior environment 9.

The housing base 2 forms at least in part coolant channels 10 through which liquid can flow, which are formed in a fluid-tight manner with respect to the installation space 4, the venting space 5 and the exterior environment 9 of the stationary induction charging device 1.

Through the coolant channels 10 through which liquid can flow, the housing base 2 forms a heat exchanger through which liquid can flow for heat exchange from the installation space 4 to the venting space 5 and/or for heat exchange from the installation space 4 to the exterior environment 9 of the stationary induction charging device 1.

The coolant channels 10 are arranged within the housing base 2 so that above all an optimum, direct cooling of the loss sources 14, which have e.g. MOSFETs, is ensured, which are part of the components of the power electronics unit. Furthermore, a liquid coolant which flows through the coolant channels 10 also receives the heat from the circulating air within the power electronics unit 8 and the installation space 4, so that also other electronics components, the transmitting coil 6 and the magnetic field conductors 7 are cooled.

The coolant channels 10 through which liquid can flow are formed and/or spatially distributed here within the housing base 2 such that a partial region 11 of the housing base 2, which is arranged lying opposite the power electronics unit 8, has a higher coolant channel density than a partial region 12 of the housing base 2 which is arranged lying opposite the transmitting coil 6. A partial region 13 of the housing base 2, which is arranged lying opposite the venting space 5, has a higher coolant channel density than the partial region 12 of the housing base 2.

The housing base 2 forms, together with the venting space 5, a liquid-air heat exchanger, wherein the heat received by the liquid coolant is emitted at least partly to the air in the venting chamber 5, wherein the liquid coolant is cooled and the air present in the venting space 5 is heated, wherein this heated air of the venting space 5 is dissipated to the air exterior environment of the stationary induction charging station 1. In addition, the liquid coolant can dissipate the received heat by means of heat conduction in part to a base exterior environment, not illustrated, of the stationary induction charging station 1.

Figure 4:
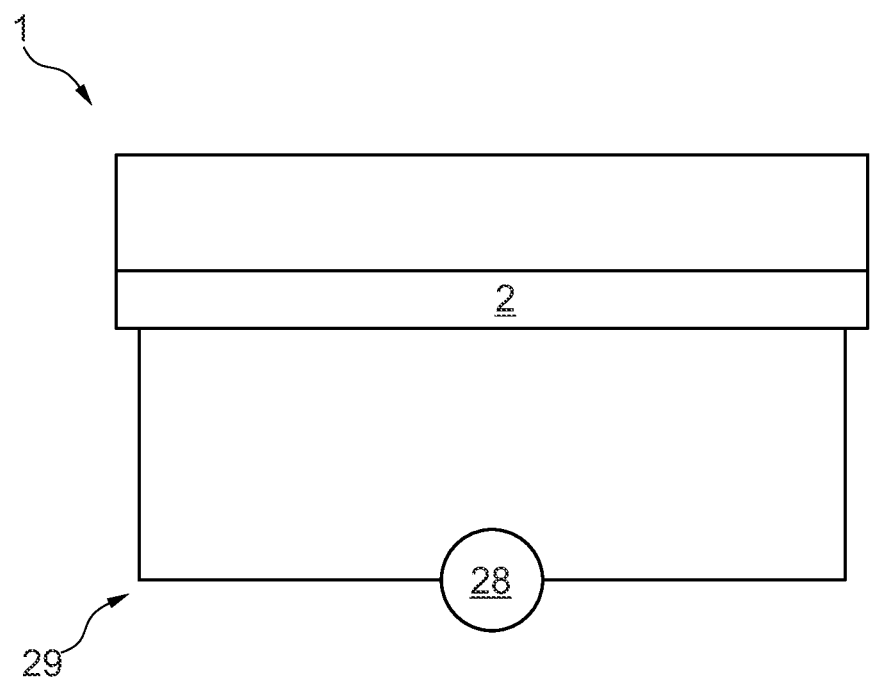
FIG. 4 shows a highly schematized closed coolant circuit, into which a stationary induction charging device according to the invention is integrated.

FIG. 4 shows a closed coolant circuit 29, into which the stationary induction charging device 1, in particular the housing base 2, is integrated. The housing base 2, in particular the coolant channels 10, are fluidically connected to a coolant conveying device 28 for the formation of a closed coolant circuit 29, wherein a liquid coolant, such as e.g. cooling water, is encapsulated in the coolant circuit 29, wherein the coolant conveying device 28 is formed for conveying the liquid coolant through the housing base 2, in particular through the coolant channels 10, and through the closed coolant circuit 29. The coolant circuit 29 can be formed such that downstream of the coolant conveying device 28 firstly the partial region 11 of the housing base 2 is flowed through by the liquid coolant. Downstream of the partial region 11 of the housing base 2, firstly the partial region 12 of the housing base 2 can be flowed through by the liquid coolant. Downstream of the partial region 12 of the housing base 2, the partial region 13 of the housing base 2 can be flowed through by the liquid coolant.

The invention claimed is:

1. A stationary induction charging device for wireless energy transfer, comprising:
   a housing base and a housing cover formed separately with respect to the housing base, the housing base and the housing cover defining an installation space and a venting space;
   a transmitting coil arranged in the installation space for providing a magnetic alternating field;
   at least one magnetic field conductor arranged in the installation space for directing the magnetic alternating field;
   a power electronics unit arranged in the installation space for at least one of supplying power to and activation of the transmitting coil;

the installation space formed in a fluid-tight manner with respect to the venting space and in a fluid-tight manner with respect to an exterior environment;

the venting space fluidically connected to the exterior environment for waste heat dissipation;

the housing base including, at least in part, a plurality of coolant channels through which a liquid is flowable;

the housing base forming, through the plurality of coolant channels, a heat exchanger through which the liquid is flowable for at least one of heat exchange from the installation space to the venting space and heat exchange from the installation space to the exterior environment;

wherein the plurality of coolant channels are formed in a fluid-tight manner with respect to the installation space, the venting space, and the exterior environment; and wherein the plurality of coolant channels are at least one of formed and spatially distributed within the housing base such that at least one of:

a first partial region of the housing base arranged opposite the power electronics unit has a higher coolant channel density than a second partial region of the housing base arranged opposite the transmitting coil; and a third partial region of the housing base arranged opposite the venting space has a higher coolant channel density than the second partial region of the housing base.

2. The stationary induction charging device according to claim 1, wherein the plurality of coolant channels have a spatial distribution adapted to a plurality of heat loss sources in the installation space such that an adapted cooling of the plurality of heat loss sources is formed.

3. The stationary induction charging device according to claim 1, wherein the power electronics unit includes a plurality of heat loss sources, and wherein at least one of:

the plurality of heat loss sources of the power electronics unit are connected to the housing base, for cooling, at least partly in a heat-conducting manner; and the plurality of heat loss sources of the power electronics unit are coupled at least partly to the housing base in a heat-exchanging manner for cooling through a forced convection via circulating air encapsulated in a fluid-tight manner in the power electronics unit.

4. The stationary induction charging device according to claim 1, wherein at least one of:

the transmitting coil is coupled in a heat-exchanging manner to the housing base for cooling substantially through a forced convection via circulating air encapsulated in a fluid-tight manner in the installation space; and the at least one magnetic field conductor is coupled in a heat-exchanging manner to the housing base for cooling substantially through a forced convection via circulating air encapsulated in a fluid-tight manner in the installation space.

5. The stationary induction charging device according to claim 1, wherein at least one of:

the power electronics unit includes a shielding housing formed separately with respect to the housing base and the housing cover, the shielding housing disposed at least partly contacting the housing base and at least partly contacting the housing cover;

at least one of the transmitting coil and the at least one magnetic field conductor is arranged spaced apart from the housing base and spaced apart from the housing cover; and the transmitting coil and the at least one magnetic field conductor are arranged spaced apart from one another.

6. The stationary induction charging device according to claim 1, wherein at least one of:

the power electronics unit includes a shielding housing that, in regions facing at least one of the transmitting coil and the at least one magnetic field conductor, is adapted at least in part such that an impairment of the magnetic alternating field provided by the transmitting coil is at least one of reduced and prevented;

the at least one magnetic field conductor includes a plurality of exterior magnetic field conductors arranged at least partly around the transmitting coil, the plurality of exterior magnetic field conductors adapted such that magnetic losses in an exterior region around the transmitting coil are reduced; and the housing cover includes a plurality of chamfered lateral regions.

7. The stationary induction charging device according to claim 1, further comprising a coil-receiving holding structure and a support structure, wherein:

the coil-receiving holding structure is arranged in the installation space;

the support structure, which is formed separately with respect to the coil-receiving holding structure, is arranged in the installation space;

the coil-receiving holding structure and the support structure are each formed separately with respect to the housing base and separately with respect to the housing cover;

the transmitting coil is received by the coil-receiving holding structure;

the coil-receiving holding structure is arranged at least partly on the housing cover and at least partly on the at least one magnetic field conductor; and the support structure is arranged at least partly on the housing base and at least partly on the at least one magnetic field conductor.

8. The stationary induction charging device according to claim 7, wherein:

the coil-receiving holding structure forms, within the installation space, a circulation venting space for incident flow on the transmitting coil;

the support structure forms, within the installation space, an incident flow space for incident flow at least on a partial region of the housing base; and the circulation venting space and the incident flow space are fluidically connected to one another.

9. The stationary induction charging device according to claim 7, wherein at least one of the coil-receiving holding structure and the support structure includes at least one incident flow opening for at least partial incident flow on the at least one magnetic field conductor.

10. The stationary induction charging device according to claim 7, wherein at least one of:

the coil-receiving holding structure forms a plurality of structure columns arranged spaced apart from one another; and the support structure forms a plurality of support columns arranged spaced apart from one another.

11. The stationary induction charging device according to claim 1, wherein at least one of:

the housing base includes a first ribbing structure projecting into the installation space to increase a surface of the housing base;

the housing base includes a second ribbing structure projecting into the venting space to increase a surface of the housing base; and the housing cover includes a reinforcement rib structure projecting into at least one of the installation space and the venting space to increase a mechanical resistance of the housing cover.

12. The stationary induction charging device according to claim 1, further comprising at least one of:
a detecting device arranged in the installation space and lying against the housing cover;
at least one first fan arranged in the installation space for providing a circulation of air which is encapsulated in the installation space in a fluid-tight manner; and
at least one second fan arranged in the power electronics unit for providing a circulation of air which is encapsulated in the power electronics unit in a fluid-tight manner.

13. The stationary induction charging device according to claim 1, wherein at least one of:
a partial region of the housing cover that partly forms the venting space includes at least one inlet venting opening via which an exterior air of the exterior environment is flowable into the venting space;
a partial region of the housing cover that partly forms the venting space includes at least one outlet venting opening via which air present in the venting space is flowable out into the exterior environment; and
at least one fan is arranged in the venting space, the at least one fan configured to at least one of draw exterior air of the exterior environment into the venting space and dissipate air present in the venting space into the exterior environment.

14. The stationary induction charging device according to claim 1, further comprising a coolant conveying device for formation of a closed coolant circuit, wherein:
the housing base is fluidically connected to the coolant conveying device;
a liquid coolant is encapsulated in the coolant circuit; and
the coolant conveying device is configured to convey the liquid coolant through the housing base and through the closed coolant circuit.

15. A stationary induction charging device for wireless energy transfer, comprising:
a housing base and a housing cover formed separately with respect to the housing base, the housing base and the housing cover defining an installation space and a venting space;
a transmitting coil arranged in the installation space for providing a magnetic alternating field;
at least one magnetic field conductor arranged in the installation space for directing the magnetic alternating field;
a power electronics unit arranged in the installation space for at least one of supplying power to and activation of the transmitting coil;
the installation space formed in a fluid-tight manner with respect to the venting space and in a fluid-tight manner with respect to an exterior environment;
the venting space fluidically connected to the exterior environment for waste heat dissipation;
the housing base including, at least in part, a plurality of coolant channels through which a liquid is flowable;
the housing base forming, through the plurality of coolant channels, a heat exchanger through which the liquid is flowable for at least one of heat exchange from the installation space to the venting space and heat exchange from the installation space to the exterior environment;

wherein the plurality of coolant channels are formed in a fluid-tight manner with respect to the installation space, the venting space, and the exterior environment; and wherein the plurality of coolant channels are at least one of formed and spatially distributed within the housing base such that:
a first partial region of the housing base arranged opposite the power electronics unit has a higher coolant channel density than a second partial region of the housing base arranged opposite the transmitting coil; and
a third partial region of the housing base arranged opposite the venting space has a higher coolant channel density than the second partial region of the housing base.

16. The stationary induction charging device according to claim 15, wherein the power electronics unit includes a shielding housing that, in regions facing at least one of the transmitting coil and the at least one magnetic field conductor, is adapted at least in part such that an impairment of the magnetic alternating field provided by the transmitting coil is at least one of reduced and prevented.

17. The stationary induction charging device according to claim 15, wherein:
the at least one magnetic field conductor includes a plurality of exterior magnetic field conductors arranged at least partly around the transmitting coil; and
the plurality of exterior magnetic field conductors are adapted such that magnetic losses in an exterior region around the transmitting coil are reduced.

18. The stationary induction charging device according to claim 15, wherein:
the housing base includes a first ribbing structure projecting into the installation space to increase a surface of the housing base;
the housing base further includes a second ribbing structure projecting into the venting space to increase a surface of the housing base; and
the housing cover includes a reinforcement rib structure projecting into at least one of the installation space and the venting space to increase a mechanical resistance of the housing cover.

19. The stationary induction charging device according to claim 15, further comprising:
a detecting device arranged in the installation space and lying against the housing cover;
at least one first fan arranged in the installation space for providing a circulation of air that is encapsulated in the installation space in a fluid-tight manner; and
at least one second fan arranged in the power electronics unit for providing a circulation of air that is encapsulated in the power electronics unit in a fluid-tight manner.

20. The stationary induction charging device according to claim 15, further comprising at least one fan arranged in the venting space, wherein:
a partial region of the housing cover partly defines the venting space;
the housing cover includes at least one inlet venting opening via which exterior air of the exterior environment is flowable into the venting space;
the housing cover further includes at least one outlet venting opening via which air present in the venting space is flowable out into the exterior environment;

the at least one inlet venting opening and the at least one outlet venting opening are disposed in the partial region of the housing cover; and the at least one fan is configured to at least one of draw exterior air of the exterior environment into the venting space and dissipate air present in the venting space into the exterior environment.

* * * * *